United States Patent [19]

Behbin et al.

[11] Patent Number: 5,262,727
[45] Date of Patent: Nov. 16, 1993

[54] NMR PROBE

[75] Inventors: Ali Behbin, San Mateo; Michael D. Cummings, Sunnyvale, both of Calif.

[73] Assignee: Varian Associates, Inc., Palo Alto, Calif.

[21] Appl. No.: 839,193

[22] Filed: Feb. 20, 1992

[51] Int. Cl.⁵ .......................................... G01R 33/20
[52] U.S. Cl. ................................. 324/318; 335/299
[58] Field of Search ............... 335/216, 299; 324/300, 324/307, 309, 318, 322; 128/653.5

[56] References Cited

U.S. PATENT DOCUMENTS

| 3,019,732 | 5/1963 | Anderson | 324/331 |
| 4,833,433 | 5/1989 | Schmettow et al. | 335/216 |
| 4,978,920 | 12/1990 | Mansfield et al. | 324/318 |
| 5,146,197 | 9/1982 | Lowe | 335/299 |

Primary Examiner—Michael J. Tokar
Attorney, Agent, or Firm—Gerald M. Fisher

[57] ABSTRACT

An NMR probe having RF shield means to confine the RF magnetic field to an axial region having a length less than the length of the coil form.

7 Claims, 9 Drawing Sheets

NMR PROBE

FIELD OF THE INVENTION

This invention is in the field of nuclear magnetic resonance (NMR) apparatus and particularly to improvements in probe structure to reduce noise.

BACKGROUND OF THE INVENTION

Nuclear magnetic resonance spectroscopy has been an important analytical technique since it became available in 1946. When atomic nuclei are placed in a constant, homogenous magnetic field of high intensity and subjected at the same time to a certain selected frequency RF alternating field, a transfer of energy can take place between the radio frequency field and the atomic nuclei to produce what is pictured as a flipping of the nuclei, which nuclei will immediately relax, i.e. flip back where they can reabsorb again resulting in a flipping back and forth. This flipping is called a resonance. More precisely, when a system of nuclei is exposed to radiation of frequency $f_o$, such that the energy $hf_o$ of a quantum of radiation, where h equals Plank's constant, is exactly equal to the energy difference between two adjacent nuclear energy levels, then energy transitions may occur in which the nuclei may be pictured as flipping back and forth from one allowed orientation to another. The apparatus for such NMR experiments is relatively simple in concept and comprises a large magnet to create a strong fixed field $H_o$ and electronic equipment to generate RF excitation energy (transmitter) which is coupled to an excitation coil. This coil is positioned around and excites a sample being investigated which is usually dissolved by a solvent in a glass test tube. An electronic receiver is also coupled to the coil. The part of the NMR spectrometer in which the sample is placed and where the excitation/receiver coil is mounted is know as the probe. In modern NMR spectrometer equipment, the receiver and transmitter are ordinarily turned on and off very quickly so that the receiver is not receiving when the transmitter is on and vice versa. While the NMR spectrometer is simple in principle, the manufacture and design are very demanding because of the very small signal generated by the processing nuclei.

It is important that the receiver coil be very closely physically coupled to the sample atoms which are dissolved in the solvent and that the receiver coil be filled as much as possible with sample material, i.e., have a large filing factor, because the intensity of the received signal in the receiver coil is related to the number of nuclei that couple to the coil and to the filing factor.

Early in NMR development, it was appreciated that a most important parameter in NMR was the homogeneity of the DC magnetic field, $H_o$. In fact, when the homogeneity was first improved from the earliest magnets, the ability of the NMR spectrometer to perform high resolution spectroscopy was discovered. High resolution spectra are those spectra where the resonance lines are narrower than the major resonance shifts caused by differences in the chemical environment of the observed nuclei, such as are caused by secondary magnetic fields of the molecules of a sample. Homogeneity is a quality of the DC magnetic field. The goal is perfect homogeneity, meaning that all atoms of the sample coupled to the receiver coil are influenced by a magnetic field having identical direction and magnitude. A large proportion of the total NMR spectrometer improvement effort in recent years has been spent in improving the probe part of the NMR spectrometer instrument to improve the techniques for coupling to the sample and to reduce the noise in the signal.

The noise in the NMR signal has a direct influence on the ability of NMR spectroscopy to provide information about the nuclear structure of the sample. It is known that if the portion of a sample in the test tube which is outside the region known as the interaction region is excited during an experiment that the signal to noise ratio is decreased. The portion of the energy received in the pick-up coil which is derived from the those nuclei outside the interaction region provides a noisier contribution, and the resonance line is said to be "broadened." This effect arises because the fixed magnetic field outside of the interaction region is not as homogeneous as the magnetic field in the interaction region. Accordingly, the sample portions located outside the interaction region will resonate at slightly different frequencies which portions contribute to a broadened line width of the resonance.

Such line broadening makes it difficult to observe relatively weak intensity spectral features nearby such broadened spectral lines. This is particularly a problem in proton experiments in which $H_2O$ is the solvent. It is known in the prior art to place conductive RF shields around portions of sample which are not in the interaction region to attempt to reduce the excitation of said sample portions by stray RF fields arising from RF feed leads as described in copending U.S. patent application Ser. No. 741,720, filed Aug. 7, 1991, now U.S. Pat. No. 5,192,911 assigned to the same assignee of the instant application. The technique described in that application discloses the addition of conductive cylindrical guard rings around the sample and a conductive disk inside the lower guard ring which disk acts to seal off the lower region by a complete RF shield.

However, to permit air flow around and across the sample for temperature control purposes the sealing disk cannot be used in many cases. Since the space is already very small in these probes, it is difficult to add an additional extension to the axial guard ring when the disk shield seal is not employed.

Accordingly, it is an object of the present invention to reduce the coupling between the lead wires and/or other sources of RF parasitic excitation to the sample outside of the interaction region and to improve the homogeneity of the RF coupling within the interaction region.

It is a further object to permit temperature control functions in a probe while at the same time shielding both top and bottom portions of the sample outside the interaction region.

SUMMARY OF THE INVENTION

These objectives are accomplished by providing a means within the probe to confine the RF magnetic fields to a small volume surrounding the RF window.

A feature of this invention is to employ a pair of conductive disks above and below the RF window as the confinement means.

DETAILED DESCRIPTION OF THE INVENTION

Figure 1:
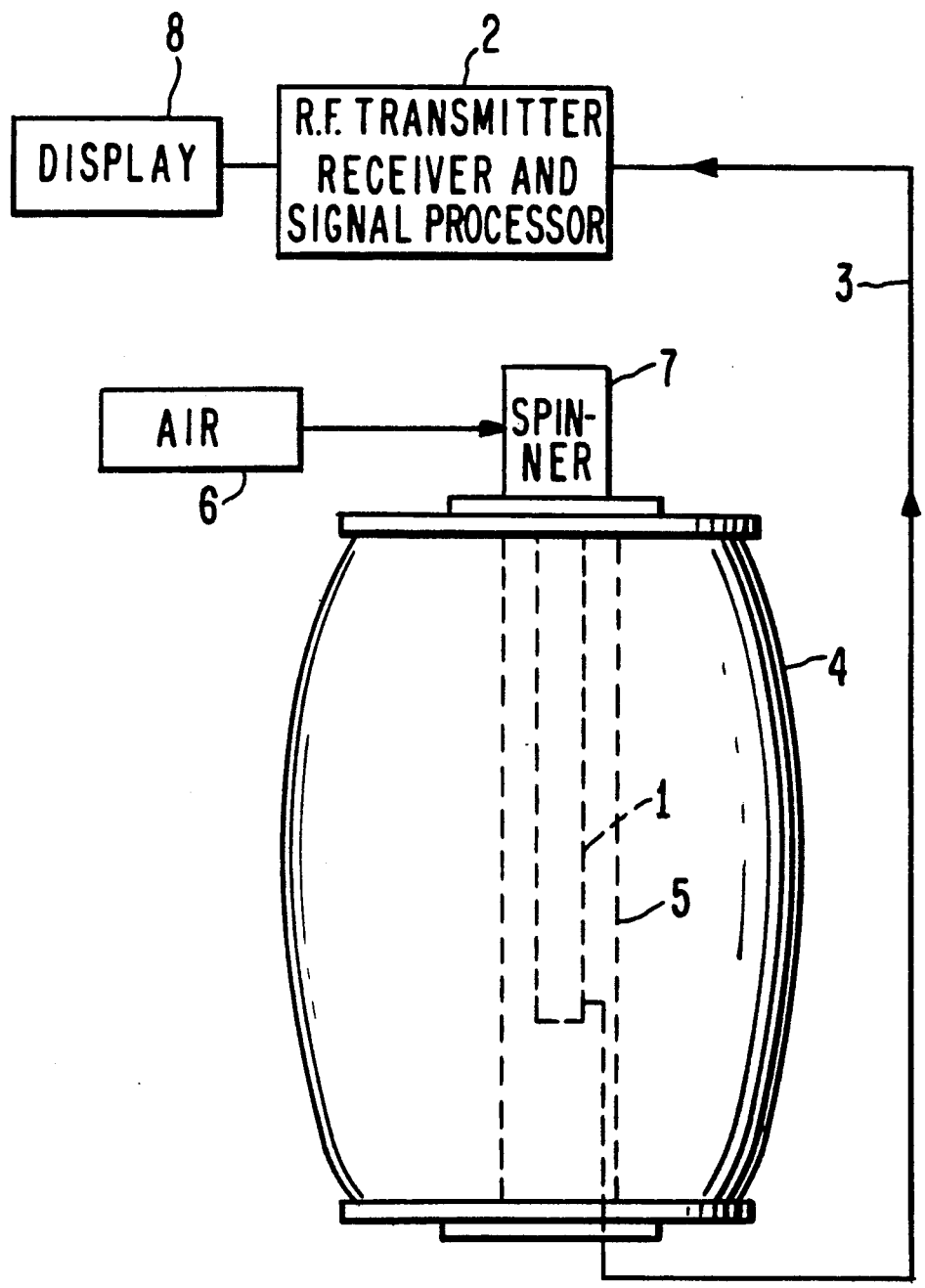
FIG. 1 is a schematic of an NMR spectrometer.

With reference to FIG. 1, a probe structure 1 is shown installed in a narrow bore 5 in a high field NMR cryogenic magnet 4. The sample to be studied is inserted into a sample tube (not shown) which is suspended and rotated at high speed by a spinner 7 inside which is part of the probe structure 1. The probe is an approximately 2 foot long, narrow 1.5 inch diameter cylindrical tube containing the power and signal wires, coils and tuning capacitors necessary to support a particular experiment. The probe 1 is coupled to the RF transmitter and receiver 2 via connections 3 and the spectra results are typically displayed on a printer or oscilloscope 8 coupled to RF transmitter/receiver 2.

Figure 2A:
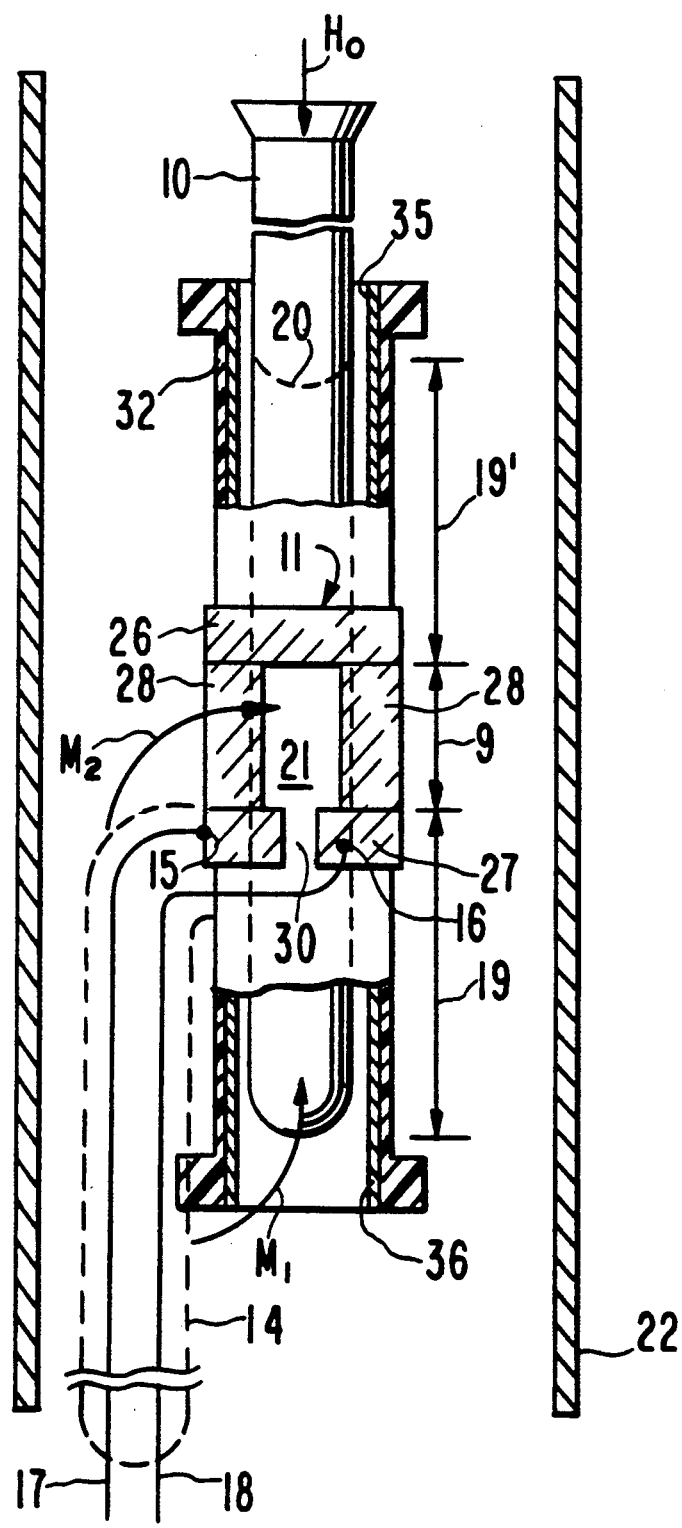
FIG. 2A illustrates the prior art schematically showing an RF saddle coil, the RF leads and the lead coupling to the non-interaction sample regions.

The prior art shielding is shown with reference to FIG. 2A. A test tube 10 contains sample with a meniscus 20 at its top. Saddle coil 11 is shown around the test tube 10 comprising an upper ring 26 and lower ring 27 connected by a pair of paraxial conductors 28. The space between the upper ring 26 and lower ring 27 between the paraxial conductors 28 creates two open windows 21, the length of which correspond to the interaction region 9. The fixed magnetic field $H_o$ has been shimmed to be as homogeneous as possible in interaction region 9. RF leads 17 and 18 to the saddle coil connection, points 15 and 16 respectively, extend out of the probe to the transmitter/receiver 2. The area 14 bracketed by dashed lines around the leads 17 and 18 near the lower area 19 of the test tube is symbolic and illustrates the region of the RF leads which most readily couples with the sample in non-interaction region 19. The coupling is called $M_1$ and symbolizes the RF magnetic and electric field coupled to the sample material in the region 19 of test tube 11. Similarly, the top of the bracket line area 14, is illustrative of RF magnetic and electric field mutually coupled $M_2$ to the sample in the interaction region 9. Since the magnetic field $H_o$ in the region 19 is not exactly homogeneous, the resonances set up by the leads 17 and 18 in the region 19 are not at the same frequency as in region 9.

Figure 2B:
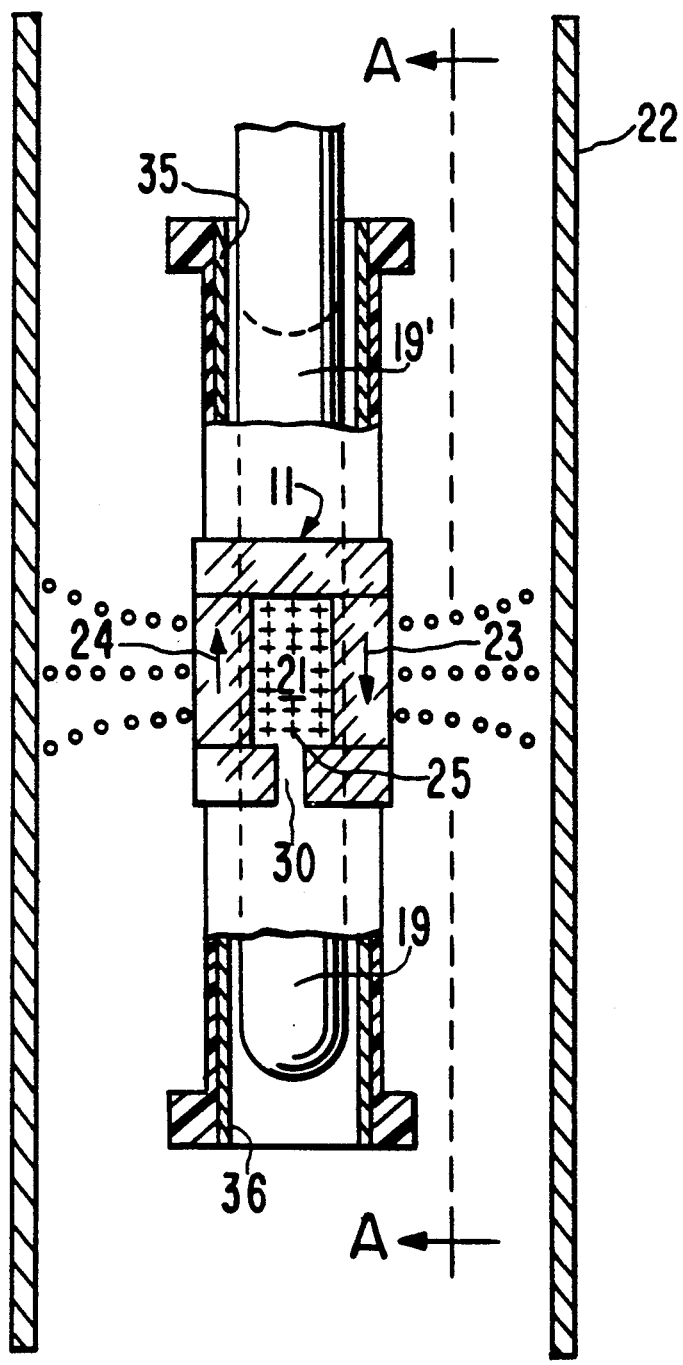
FIG. 2B is a schematic of the instantaneous RF field configuration of FIG. 2A and illustrates one view of the RF magnetic field generated by a current in the saddle coil.
Figure 2C:
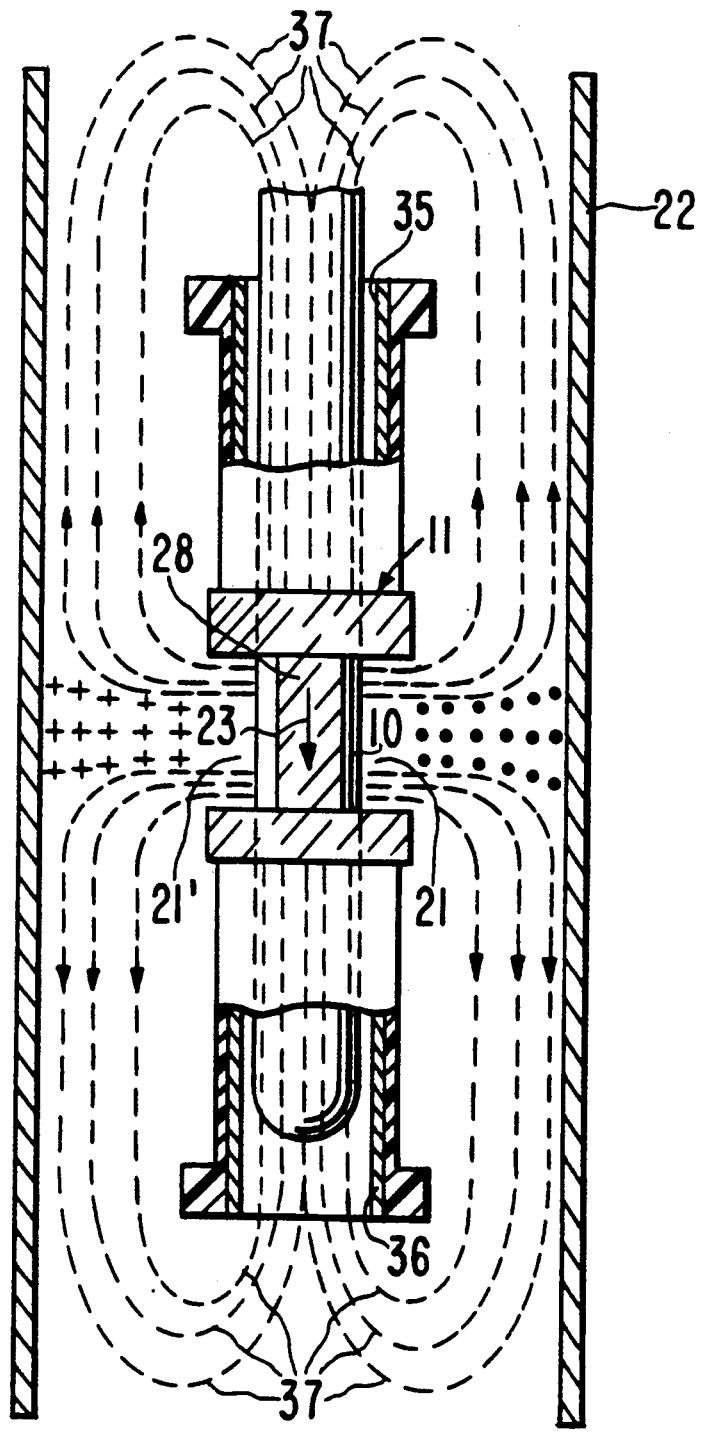
FIG. 2C is a section AA view of FIG. 2B showing the RF field lines as viewed from the side of saddle coil.

Also, with reference to the coupling $M_2$, it is expected that this coupling will slightly distort the magnetic field from the ideal RF homogeneity both inside and outside the window region 21. For the prior art configuration of FIG. 2A, the ideal RF field lines are believed to be schematically illustrated in FIG. 2B and FIG. 2C. The cylindrical conductive guard ring shields 35 and 36 and the probe shield (outer shell) 22 constrain the RF fields. Note that the shields 35 and 36 generally preclude the RF magnetic field generated by the saddle coil currents 23 and 24 from entering into the region of sample 19 and 19'. However, as shown in FIG. 2C, the magnetic field lines at right angles to the currents illustrated by arrows 23 and 24 are shown entering into the plane of the paper in the window region 21 and exiting the plane of the paper elsewhere in the probe space. As shown in FIG. 2C, a substantial portion of the RF fields exiting windows 21 and 21' close their path by returning along the axis of the probe. These RF field lines 37 have substantial coupling with the sample which is outside of the RF window region. All of these RF fields 37 are deleterious in that the static magnetic field outside the RF window does not have the best homogeneity and results in line broadening.

Figure 3A:
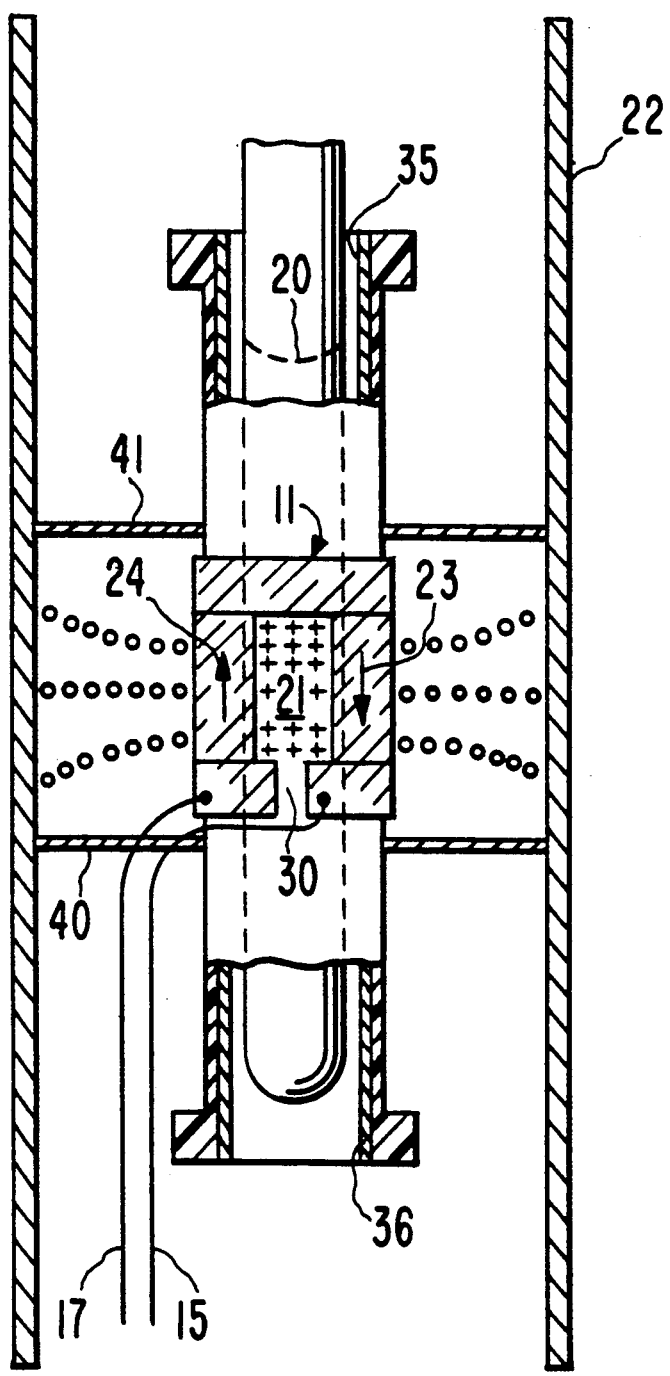
FIG. 3A is a schematic illustrating the instantaneous RF field configuration with the shield of our invention.

With reference to FIG. 3A, the RF field is schematically illustrated in connection with the disk shields 40 and 41 of our invention. We believe that the complete containment of the fields in the region between the probe shield 22, the disks 40 and 41 and the shields 35 and 36 tends to constrain the spatial spread of the field and to inhibit the excitation of signal from parts of the sample at different static magnetic field strengths as compared to the RF window regions. Clearly, the contribution to signal excitation in the window region 21 from the mutual coupling $M_2$ and from the deleterious lines 37 is diminished by the disks 40 and 41. The amount of this effect depends on how close the disks 40 and 41 are mounted to the edge of the RF window. However, other factors are involved also in that compression of the field lines results in an apparent increase in the probe inductance which implies that the probe RF tuning may be varied by the positioning of the disks around the RF window without significantly changing the $M_2$ coupling.

Figure 3B:
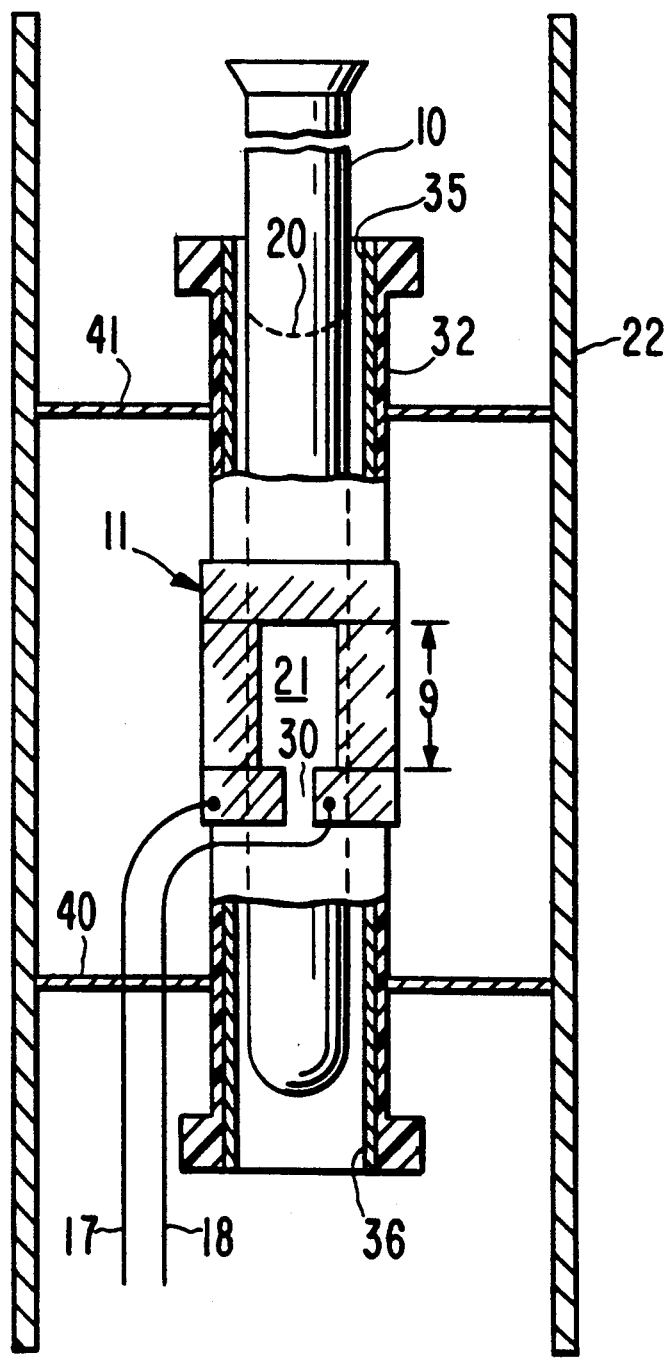
FIG. 3B is the cross section of preferred embodiment of the invention.
Figure 5:
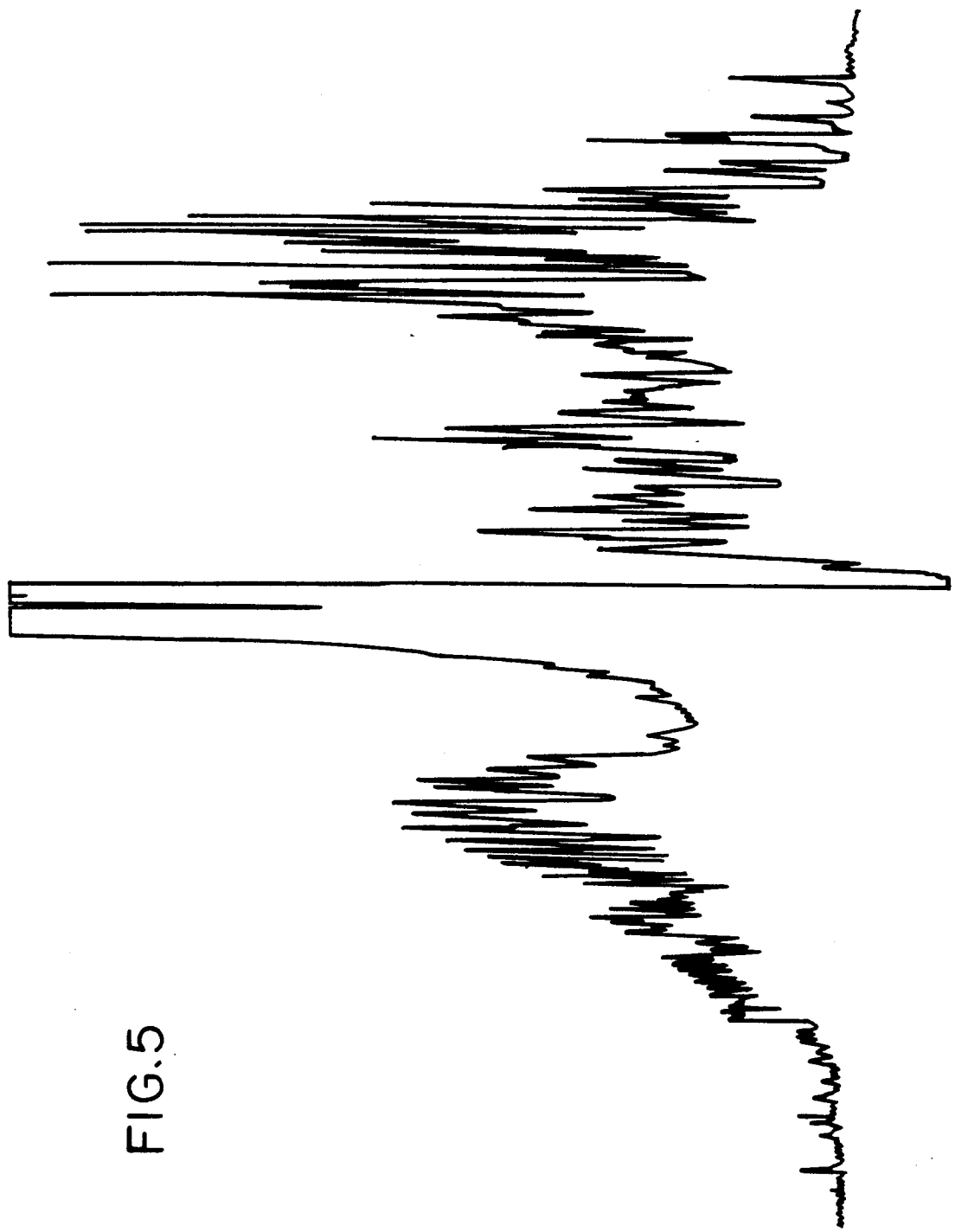
FIG. 5 shows an example spectrum obtained from a lysozyme sample in $H_2O$ solvent in a $H_2O$ suppression experiment with our invention.
Figure 6:
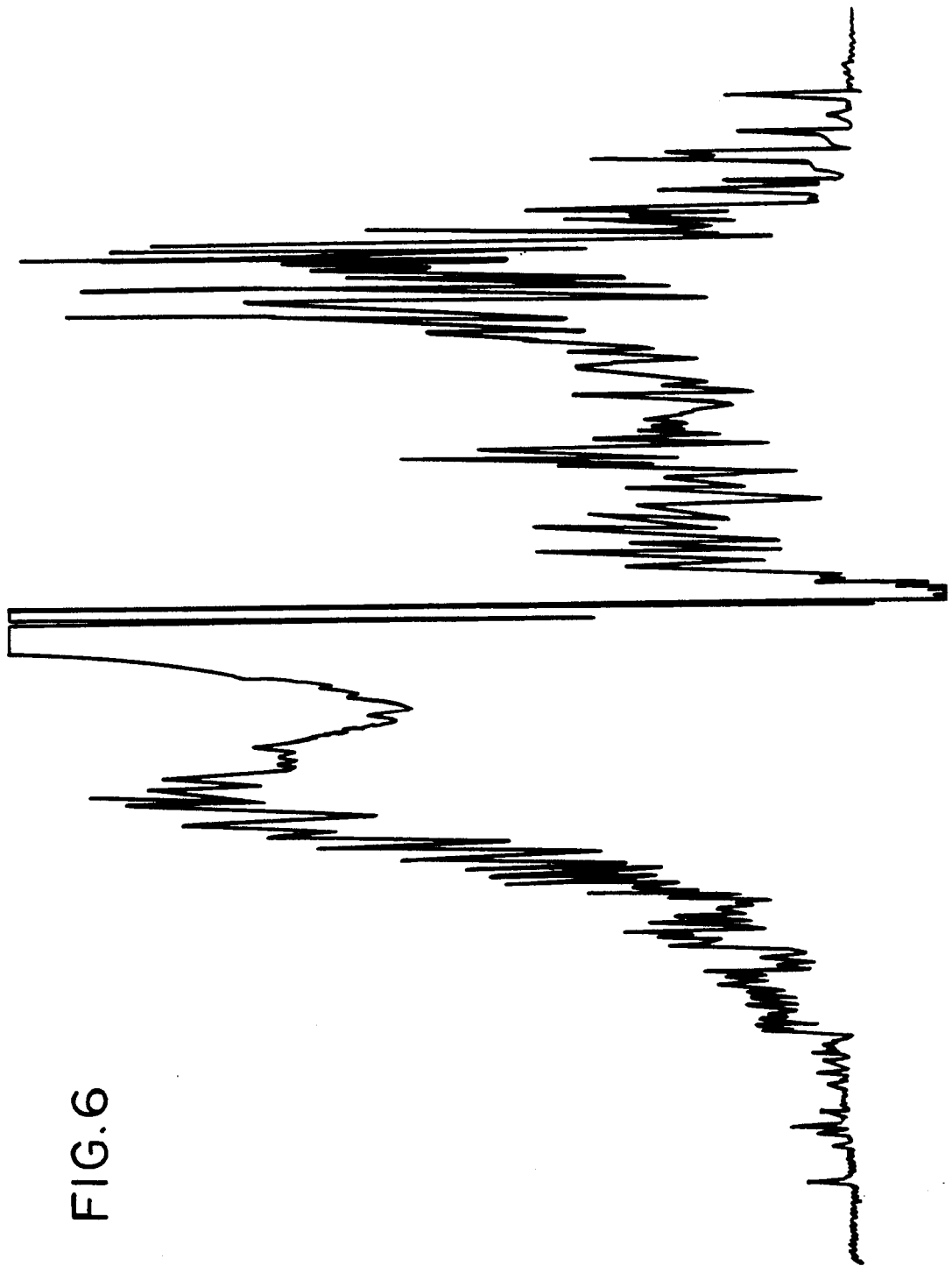
FIG. 6 is the spectra of lysozyme in $H_2O$ solvent in an $H_2O$ suppression experiment without our inventive disks.

FIG. 3B shows the structure of the preferred embodiment of our invention and discloses the relationship between the cylindrical shields 35 and 36 and the disk shields 40 and 41 with respect to the RF window 21 of saddle coil 11. The spectra of FIG. 5 were obtained using the probe of FIG. 3B with a lysozyme sample in $H_2O$ solvent. The experiment employs a technique to suppress the large resonance line from the protons of the water solvent. The base line near the large water resonance is much improved in FIG. 5 as compared to the spectra obtained without the inventive disks as shown in FIG. 6.

The disks 40 and 41 are preferably conductive, solid, thin, i.e. 0.003 inch disks, made of copper, silver or zero susceptibility materials such as disclosed in U.S. Pat. No. 3,091,732. The conductive layer on the disk should be greater than the skin depth to obtain the full benefits of the invention. Skin depth is the well known term defined by the equation:

$$\delta = \frac{1}{\sqrt{\pi f \mu \sigma}}$$

Figure 4:
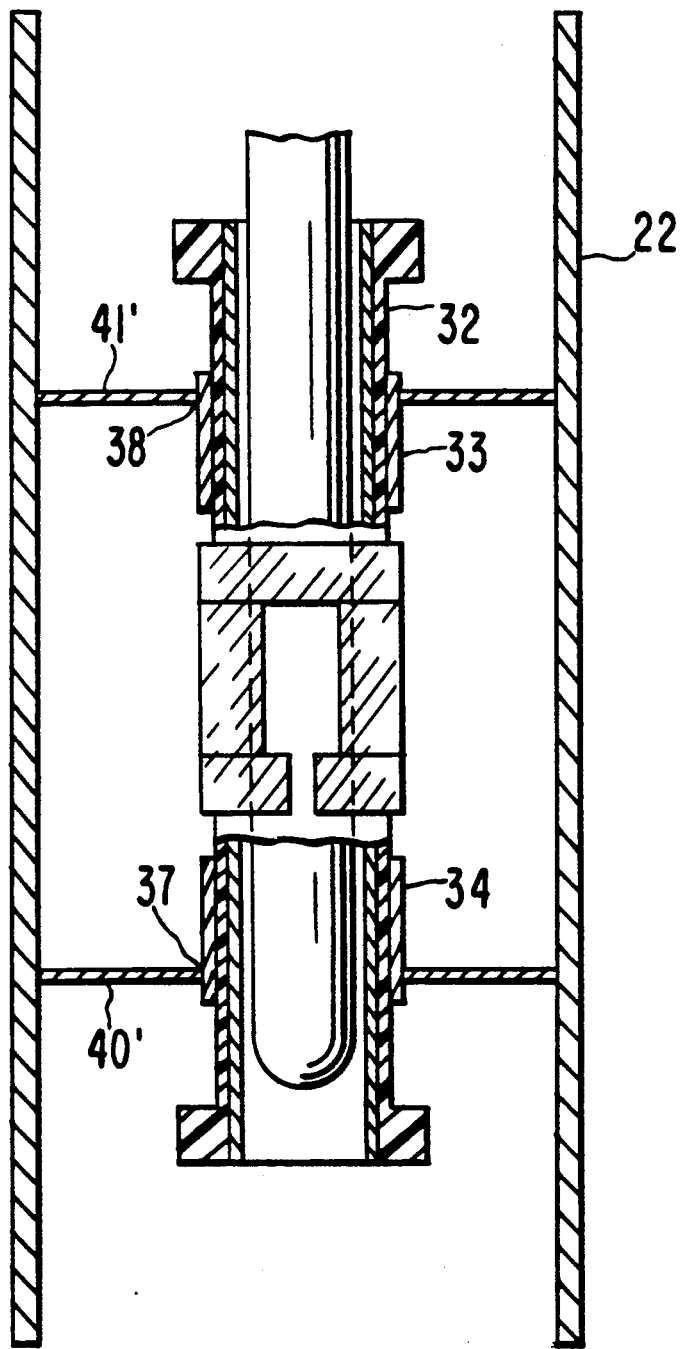
FIG. 4 shows a cross section of another embodiment of our invention.

The FIG. 4 embodiment is identical to the FIG. 3B embodiment except for the inclusion of an additional conductive cylindrical shield 33 and 34 on the outer surface of the coil form 32 which permits good shielding continuity across the joint 37 and 38 between the disks 40' and 41' respectively and the cylindrical shields 33 and 34. In the embodiment of FIG. 3B, the disk shields 40 and 41 do not actually contact shield 36 and 35 because of the thickness of the coil form insert. This small space may permit some field leakage.

It is to be understood that many changes can be made in the specifically described embodiments without departing from the scope of the invention and that the invention is to be determined from the scope of the following claims without limitation to the specifically described embodiments with this in mind.

We claim:

1. In an NMR probe comprising a tubular RF coil form having an axis and a length along said axis, an RF saddle coil having an RF window, said RF saddle coil being mounted to said RF coil form, first cylindrical RF shield co-axial with said axis, said first cylindrical shield being mounted to said coil form above and below said RF saddle coil, said first cylindrical RF shield extending up to said RF window, a second cylindrical RF shield coaxial with said axis, said second cylindrical RF shield being the outside tube of said NMR tubular probe, the improvement comprising, electrically conductive means mounted within said NMR tubular probe for confining the RF magnetic field which exits said RF window, in operation, to a region having a length less than said length of said RF coil form.

2. The probe of claim 1 wherein said electrically conductive means to confine the RF magnetic field which exits said RF window, in operation, comprises a pair of metal disks mounted between said first cylindrical shield and said second cylindrical shield above and below said RF saddle coil.

3. The probe of claim 2 wherein said disks are perpendicular to said axis and wherein the outside periphery of said disks said are in contact with said second cylindrical shield.

4. The probe of claim 3 wherein the inside periphery of said disks are in contact with said RF coil form.

5. The probe of claim 3 wherein said RF coil form has a third RF cylindrical RF shield on the exterior surface of said coil form above and below said RF saddle coil and wherein said disks have a central aperture therein and wherein the inside periphery of said central aperture of said disks is in contact with said third RF cylindrical RF shield.

6. The probe of claim 4 wherein the thickness of said disks is greater than the skin depth for 600 MHz RF in the material involved.

7. The probe of claim 6 wherein said disks are copper and the thickness is substantially 0.003 inches.

* * * * *